United States Patent
Kim et al.

(10) Patent No.: US 10,114,047 B2
(45) Date of Patent: Oct. 30, 2018

(54) CONTROL LINE DIAGNOSTIC APPARATUS (71) Applicant: LG CHEM, LTD., Seoul (KR)

(72) Inventors: Woo-Jung Kim, Daejeon (KR); Tae-Youn Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/559,618

(22) PCT Filed: Jul. 1, 2016

(86) PCT No.: PCT/KR2016/007140
§ 371 (c)(1),
(2) Date: Sep. 19, 2017

(87) PCT Pub. No.: WO2017/034144
PCT Pub. Date: Mar. 2, 2017

(65) Prior Publication Data
US 2018/0067149 A1 Mar. 8, 2018

(30) Foreign Application Priority Data
Aug. 26, 2015 (KR) ........................ 10-2015-0120325

(51) Int. Cl.
*G01R 19/165* (2006.01)
*G01R 31/327* (2006.01)
(Continued)

(52) U.S. Cl.
CPC ....... *G01R 19/165* (2013.01); *G01R 19/0084* (2013.01); *G01R 31/02* (2013.01);
(Continued)

(58) Field of Classification Search
CPC .. G01R 19/165; G01R 31/021; G01R 31/327; G01R 19/0084; G01R 31/36;
(Continued)

(56) References Cited

U.S. PATENT DOCUMENTS 5,153,809 A * 10/1992 Murakami ............. G01R 31/40
361/18
7,183,934 B2 * 2/2007 Alvord ............... G01R 31/3278
324/537
(Continued)

FOREIGN PATENT DOCUMENTS

JP          7-4644 Y2    2/1995
KR   10-2007-011427 A   11/2007
(Continued)

OTHER PUBLICATIONS

International Search Report, issued in PCT/KR2016/007140 (PCT/ISA/210), dated Oct. 24, 2016.

*Primary Examiner* — An T Nguyen
(74) *Attorney, Agent, or Firm* — Birch, Stewart, Kolasch & Birch, LLP (57) ABSTRACT

Disclosed is a control line diagnostic apparatus for diagnosing a control line of a driver circuit in which a driven load is driven due to a current flowing through the control line from a first high-potential node to a first low-potential node when a driving switch having a higher potential than a potential of the driven load is turned on, the control line diagnostic apparatus including a first diagnostic line having an end connected to a first node provided on the control line and the other end connected to a second high-potential node, and including a first resistor, a second resistor, and a first diode connected to one another in series, a second diagnostic line having an end connected to the first node and the other end connected to a second low-potential node, and including a third resistor, a voltage measurement unit configured to measure a voltage of a second node provided between the first and second resistors, and a control unit configured to set predetermined operation modes by controlling the driving switch and to diagnose a state of the control line by using voltage values of the second node, which are measured by (Continued)

the voltage measurement unit in the set operation modes, wherein the first diode is provided on the first diagnostic line to allow flow of a current from the second high-potential node to the first node.

10 Claims, 10 Drawing Sheets

(51) Int. Cl.
*G01R 31/36* (2006.01)
*G01R 31/02* (2006.01)
*G01R 19/00* (2006.01)
*B60R 16/023* (2006.01)

(52) U.S. Cl.
CPC .......... *G01R 31/021* (2013.01); *G01R 31/327* (2013.01); *G01R 31/36* (2013.01); *B60R 16/0232* (2013.01); *G01R 31/3278* (2013.01)

(58) Field of Classification Search
CPC .......... G01R 31/3278; G01R 19/16504; G01R 31/026; G01R 31/3696; G01R 31/025; G01R 19/16571; G01R 31/3658; G01R 31/006; G01R 31/02
See application file for complete search history.

(56) References Cited

U.S. PATENT DOCUMENTS

| | | | |
|---|---|---|---|
| 7,733,059 B2 | 6/2010 | Yoshida | |
| 2004/0036446 A1* | 2/2004 | Iwashima | G01R 31/3658 320/116 |
| 2005/0253458 A1* | 11/2005 | Omae | H01M 6/36 307/10.1 |
| 2006/0214810 A1* | 9/2006 | Alvord | G01R 31/3278 340/635 |
| 2014/0300377 A1 | 10/2014 | Onodera | |
| 2015/0219705 A1* | 8/2015 | Zaki | B60L 3/12 324/503 |
| 2018/0067149 A1* | 3/2018 | Kim | G01R 31/327 |

FOREIGN PATENT DOCUMENTS

| | | |
|---|---|---|
| KR | 10-2008-0056654 A | 6/2008 |
| KR | 10-1458128 B1 | 11/2014 |

* cited by examiner

| OPERATION MODE OF DRIVING SWITCH | STATE OF CONTROL LINE | VOLTAGE OF SECOND NODE |
|---|---|---|
| On | NORMAL STATE | $V(D_1)+(V_{CC2}-V(D_1)) \times \frac{R_2}{R_1+R_2}$ |
| | OPEN STATE | $V(D_1)+(V_{CC2}-V(D_1)) \times \frac{R_2}{R_1+R_2}$ |
| | HIGH-POTENTIAL SHORT STATE | $V_{CC2}$ |
| | LOW-POTENTIAL SHORT STATE | $V(D_1)+(V_{CC2}-V(D_1)) \times \frac{R_2}{R_1+R_2}$ |
| Off | NORMAL STATE | $V_{CC2}$ |
| | OPEN STATE | $V(D_1)+(V_{CC2}-V(D_1)) \times \frac{R_2+R_3}{R_1+R_2+R_3}$ |
| | HIGH-POTENTIAL SHORT STATE | $V_{CC2}$ |
| | LOW-POTENTIAL SHORT STATE | $V(D_1)+(V_{CC2}-V(D_1)) \times \frac{R_2}{R_1+R_2}$ |

FIG. 17

CONTROL LINE DIAGNOSTIC APPARATUS

TECHNICAL FIELD

The present disclosure relates to a technology of diagnosing the state of a control line, which controls driving of a driven load, by selectively allowing a current to flow therethrough, and more particularly, to a control line diagnostic apparatus capable of diagnosing various abnormal states of the control line.

The present application claims priority to Korean Patent Application No. 10-2015-0120325 filed on Aug. 26, 2015 in the Republic of Korea, the disclosures of which are incorporated herein by reference.

BACKGROUND ART

Electric products, which are broadly used in daily lives, are configured to be driven based on conduction of a current when the current flows through a control line. For example, a relay is configured to close an electrical circuit when a current flows through a control line included in the relay, and to open the electrical circuit when a current does not flow through the control line. However, if the control line is shorted or open for any reason, the current abnormally flows through the control line and thus a driven load may not be controlled.

A representative example of the above-described relay is a relay used in an electric vehicle. The electric vehicle, which attracts global attention these days, includes a relay to control electrical connection between a secondary battery and an electric motor. The relay is controlled by a control system of the electric vehicle, and the control system autonomously has a diagnostic function to diagnose the state of a relay control line. However, the diagnostic function of the control system is performed by adding a current sensing circuit to determine whether a current flows through the control line, or by additionally using a high-priced device. Currently, transition of a relay control function to a battery management system (BMS) is highly demanded, and thus the BMS is highly required to autonomously diagnose the relay control line. To autonomously diagnose the state of the relay control line by the BMS, a relatively low-priced and compact diagnostic apparatus is needed.

DISCLOSURE

Technical Problem

The present disclosure is designed to solve the problems of the related art, and therefore the present disclosure is directed to providing an apparatus capable of accurately diagnosing the state of a control line of a driven load at a relatively low cost.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a control line diagnostic apparatus for diagnosing a control line of a driver circuit in which a driven load is driven due to a current flowing through the control line from a first high-potential node to a first low-potential node when a driving switch having a higher potential than a potential of the driven load is turned on, the control line diagnostic apparatus including a first diagnostic line having an end connected to a first node provided on the control line and the other end connected to a second high-potential node, and including a first resistor, a second resistor, and a first diode connected to one another in series, a second diagnostic line having an end connected to the first node and the other end connected to a second low-potential node, and including a third resistor, a voltage measurement unit configured to measure a voltage of a second node provided between the first and second resistors, and a control unit configured to set predetermined operation modes by controlling the driving switch and to diagnose a state of the control line by using voltage values of the second node, which are measured by the voltage measurement unit in the set operation modes, wherein the first diode is provided on the first diagnostic line to allow flow of a current from the second high-potential node to the first node.

The control unit may diagnose the state of the control line by comparing a voltage value of the second node, which is measured in an operation mode in which the driving switch is turned on, and a voltage value of the second node, which is measured in an operation mode in which the driving switch is turned off, to values recorded in a premade diagnostic table.

The state of the control line may be one of a high-potential short state in which the control line is connected to the first high-potential node, a low-potential short state in which the control line is connected to the first low-potential node, an open state in which the control line is disconnected, and a normal state.

The first diagnostic line may further include a first diagnostic switch configured to be selectively turned on or off, and the control unit may control the first diagnostic switch to be turned on, in order to diagnose the control line.

The second diagnostic line may further include a second diagnostic switch configured to be selectively turned on or off, and the control unit may control the second diagnostic switch to be turned on, in order to diagnose the control line.

The first and second low-potential nodes may be grounded.

The second high-potential node may have a potential equal to or lower than a potential of the first high-potential node.

The driven load may be a relay.

In another aspect of the present disclosure, there is also provided a battery management system (BMS) including the above-described control line diagnostic apparatus.

In another aspect of the present disclosure, there is also provided a battery pack including the above-described control line diagnostic apparatus.

Advantageous Effects

According to the present disclosure, an apparatus capable of accurately diagnosing the state of a control line of a driven load at a relatively low cost may be provided.

The present disclosure may also have a variety of other effects, and these and other effects of the present disclosure may be understood from the following detailed description and will become more fully apparent from the exemplary embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIGS. 6 to 9 are circuit diagrams showing four available states of the control line in an operation mode in which a driving switch is turned on.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In the following description of the present disclosure, a detailed description of known functions and configurations incorporated herein will be omitted when it may make the subject matter of the present disclosure unclear.

Throughout the specification, it will be understood that the terms "comprises" and/or "comprising" specify the presence of stated components but do not preclude the presence or addition of one or more other components, unless the context clearly indicates otherwise. A term such as "control unit" used herein refers to a unit of processing at least one function or operation, which may be implemented as hardware, software, or a combination of hardware and software.

It will be further understood that when a component is referred to as being "connected to" another component, it can be directly connected to the other component, or an intervening component may also be present.

Figure 1:
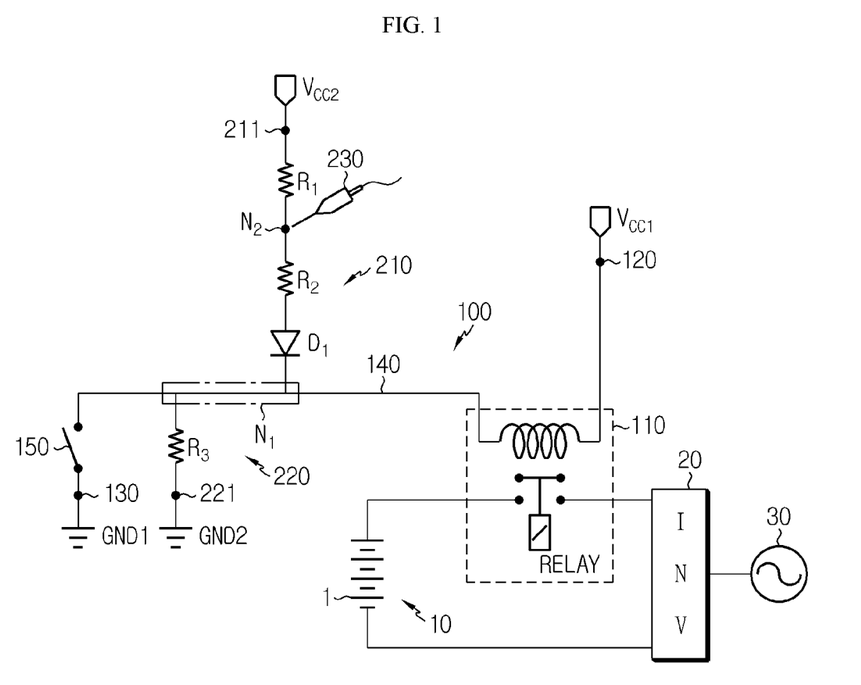
FIG. 1 is a circuit diagram of a control line diagnostic apparatus according to an embodiment of the present disclosure.

FIG. 1 is a circuit diagram of a control line diagnostic apparatus 200 according to an embodiment of the present disclosure.

Referring to FIG. 1, the control line diagnostic apparatus 200 according to the current embodiment of the present disclosure diagnoses the state of a control line 140 included in a driver circuit 100. In the embodiment of FIG. 1, the control line diagnostic apparatus 200 diagnoses the state of the control line 140 of a relay 110 configured to electrically connect a battery pack 10 to a load. In FIG. 1, the load is an electric motor 30, and the electric motor 30 is electrically connected to the battery pack 10 by disposing an inverter 20 therebetween.

The battery pack 10 includes one or more battery cells 1 and a battery management system (BMS).

The battery cells 1 are energy storages and may be lithium secondary batteries. However, the type of the battery cells 1 is not limited thereto. The battery cells 1 may be connected to one another in series or in parallel and thus may be modularized. That is, the battery cells 1 may be connected to one another in series, in parallel, or in series and in parallel. In the embodiment of FIG. 1, a plurality of battery cells 1 are connected to one another in series. However, the number and the connection type of the battery cells 1 are not limited thereto.

The BMS monitors the state of each battery cell 1 and the state of the battery pack 10, and performs a variety of control functions.

The driver circuit 100 includes a driven load 110, a first high-potential node 120, a first low-potential node 130, the control line 140, and a driving switch 150. In the embodiment of FIG. 1, the driver circuit 100 is a circuit configured to drive the relay 110, and the driven load 110 may also be referred to as the relay 110.

The control line 140 is connected between the driven load 110 and the driving switch 150, and provides a current path when the driving switch 150 is turned on.

The driving switch 150 is connected to an end of the control line 140, and may be a switching device configured to be selectively turned on or off based on a control signal. The driving switch 150 may be implemented as one of a variety of switching devices. According to an embodiment, the driving switch 150 may be implemented as a metal-oxide-semiconductor field-effect transistor (MOSFET). The driving switch 150 may be turned on or off by receiving a control signal from a control unit to be described below.

The first high-potential node 120 has a higher potential than that of the first low-potential node 130 and allows a current to flow through the control line 140 from the first high-potential node 120 to the first low-potential node 130 when the driving switch 150 is turned on. The first high-potential node 120 is connected to a power supply $V_{cc1}$ and thus may have a higher potential than that of the first low-potential node 130. According to an embodiment, the power supply $V_{cc1}$ may receive power from the battery pack 10.

The first low-potential node 130 has a lower potential than that of the first high-potential node 120 and allows a current to flow through the control line 140 from the first high-potential node 120 to the first low-potential node 130 when the driving switch 150 is turned on. The first low-potential node 130 may be connected to a ground GND 1 having a lower potential than that of the power supply $V_{cc1}$.

The driven load 110 is connected to the other end of the control line 140 and is configured to be driven when a current flows through the control line 140. In the embodiment of FIG. 1, the driven load 110 is the relay 110 and, when a current flows through the control line 140, contact points are connected to one another and thus electrical connection is established between the battery pack 10 and the load.

The driving switch 150 is connected adjacent to the first low-potential node 130, and the driven load 110 is connected adjacent to the first high-potential node 120. That is, the driven load 110 has a higher potential than that of the driving switch 150. As illustrated in FIG. 1, the driving switch 150 is a low-side switch and is provided between the driven load 110 and the first low-potential node 130. The low-side switch differs from a high-side switch provided between the first high-potential node 120 and the driven load 110.

The above-described driver circuit 100 is a relay driver circuit 100, and the control line 140 included in the driver circuit 100 is used to drive the relay 110. However, the relay 110 is merely an example and the control line 140 may be used to drive a driver circuit other than the relay 110. That is, the driver circuit 100 disclosed in the present disclosure may also be used to drive a cooling fan, a cooling pump, or the like configured to cool a battery, and may be applied to technologies other than the battery technology. Likewise, the control line diagnostic apparatuses 200 to be described below may diagnose not only the state of the control line 140 included in the relay driver circuit 100 but also the state of the control line 140 included in various driver circuits.

The control line diagnostic apparatus 200 according to the current embodiment of the present disclosure may diagnose the state of the control line 140 included in the above-described driver circuit 100. The control line diagnostic apparatus 200 according to the current embodiment of the present disclosure may include a first diagnostic line 210, a second diagnostic line 220, a voltage measurement unit 230, and a control unit.

The first diagnostic line 210 may be connected between the control line 140 and a second high-potential node 211. Specifically, an end of the first diagnostic line 210 may be connected to a first node $N_1$ provided on the control line 140, and the other end of the first diagnostic line 210 may be connected to the second high-potential node 211. The second high-potential node 211 has a higher potential than that of a second low-potential node 221 to be described below. According to an embodiment, a power supply $V_{cc2}$ having a potential equal to or lower than that of the power supply $V_{cc1}$ may be connected to the second high-potential node 211. Herein, the first node $N_1$ refers to an electrical node provided between the driven load 110 and the driving switch 150.

A first resistor $R_1$, a second resistor $R_2$, and a first diode $D_1$ may be provided on the first diagnostic line 210. The first resistor $R_1$, the second resistor $R_2$, and the first diode $D_1$ may be configured to be connected to one another in series. Herein, an electrical node provided between the first resistor $R_1$ and the second resistor $R_2$ may be referred to as a second node $N_2$. The second node $N_2$ may be used as a node where the voltage measurement unit 230 to be described below measures a voltage. The first diode $D_1$ is a device configured to allow a current to flow in a direction, i.e., a rectifier. As illustrated in FIG. 1, the first diode $D_1$ may be provided on the first diagnostic line 210 to allow the flow of a current from the second high-potential node 211 to the first node $N_1$, and to block the flow of a current in an opposite direction.

The second diagnostic line 220 may be connected between the control line 140 and the second low-potential node 221. Specifically, an end of the second diagnostic line 220 may be connected to the first node $N_1$, and the other end of the second diagnostic line 220 may be connected to the second low-potential node 221. The second low-potential node 221 has a lower potential than that of the second high-potential node 211. The second low-potential node 221 may be connected to a ground GND 2. The ground GND 2 connected to the second low-potential node 221 and the ground GND 1 connected to the first low-potential node 130 may be a common ground or independent grounds.

The voltage measurement unit 230 may measure a voltage of the second node $N_2$. According to an embodiment, the voltage measurement unit 230 may include a voltage sensor to measure the voltage of the second node $N_2$ (see FIG. 1). The voltage measurement unit 230 may transmit the measured voltage of the second node $N_2$ to the control unit to be described below.

The control unit may control a switching operation of the driving switch 150. The control unit may set operation modes by controlling the switching operation of the driving switch 150. In addition, the control unit may diagnose the state of the control line 140 by using voltage values of the second node $N_2$, which are measured by the voltage measurement unit 230 in the set operation modes.

According to an embodiment, the control unit may turn on the driving switch 150 to receive a voltage value of the second node $N_2$, which is measured by the voltage measurement unit 230 in an operation mode in which the driving switch 150 is turned on, turn off the driving switch 150 to receive a voltage value of the second node $N_2$, which is measured by the voltage measurement unit 230 in an operation mode in which the driving switch 150 is turned off, and diagnose the state of the control line 140 by using the received voltage values. Specifically, the control unit may diagnose the state of the control line 140 by comparing the voltage value of the second node $N_2$, which is measured in the operation mode in which the driving switch 150 is turned on, and the voltage value of the second node $N_2$, which is measured in the operation mode in which the driving switch 150 is turned off, to values recorded in a premade diagnostic table.

The state of the control line 140 may be basically divided into a normal state and an abnormal state, and the abnormal state may be sub-divided into a high-potential short state in which the control line 140 is connected to the first high-potential node 120, a low-potential short state in which the control line 140 is connected to the first low-potential node 130, and an open state in which the control line 140 is disconnected.

FIGS. 2 to 5 are circuit diagrams showing four states of the control line 140 included in the driver circuit 100. Specifically, FIGS. 2 to 5 illustrate the driver circuit 100 of FIG. 1, and show four available states of the control line 140.

Figure 2:
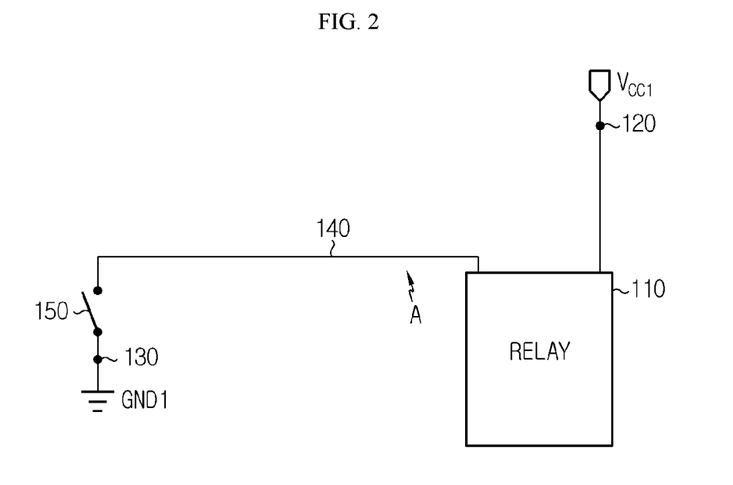
FIGS. 2 to 5 are circuit diagrams showing four states of a control line included in a driver circuit.
Figure 3:
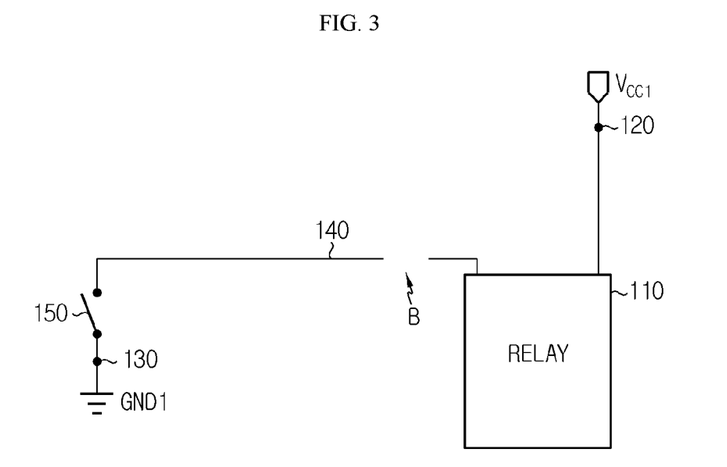
Figure 4:
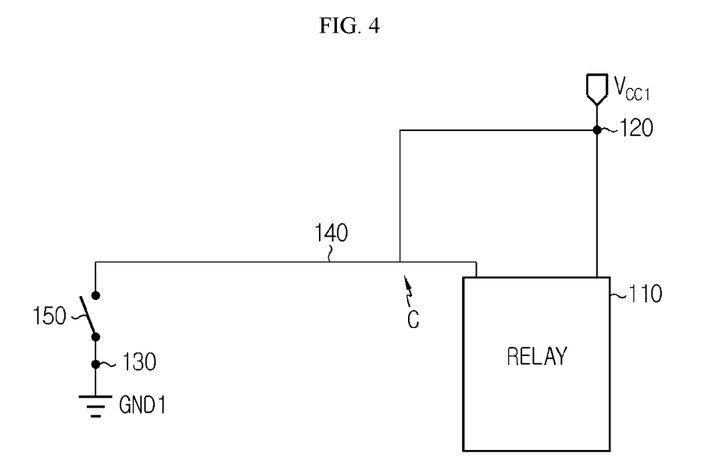
Figure 5:
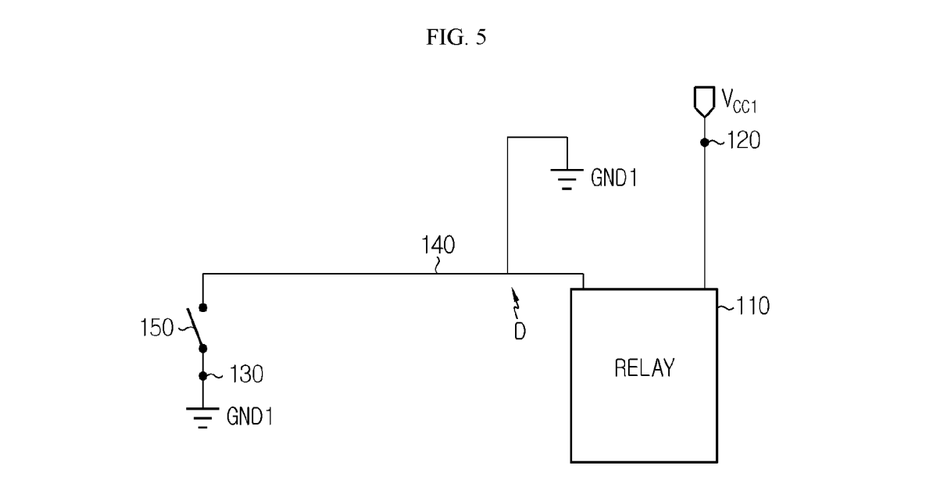

FIG. 2 illustrates the control line 140 in a normal state (see arrow A). FIG. 3 illustrates the control line 140 in an open state (see arrow B). FIG. 4 illustrates the control line 140 in a high-potential short state (see arrow C). FIG. 5 illustrates the control line 140 in a low-potential short state (see arrow D).

A process of making a diagnostic table according to an embodiment of the present disclosure will now be described. Thereafter, a process of diagnosing the state of the control line 140 by comparing the voltage values of the second node $N_2$, which are measured in predetermined operation modes, to values recorded in the diagnostic table, according to an embodiment of the present disclosure will be described.

A process of calculating a voltage of the second node $N_2$ in four available states of the control line 140 in an operation mode in which the driving switch 150 is turned on will now be described.

FIGS. 6 to 9 are circuit diagrams showing four available states of the control line 140 in an operation mode in which the driving switch 150 is turned on.

<Operation Mode in which Driving Switch is Turned on, and Normal State of Control Line>

Figure 6:
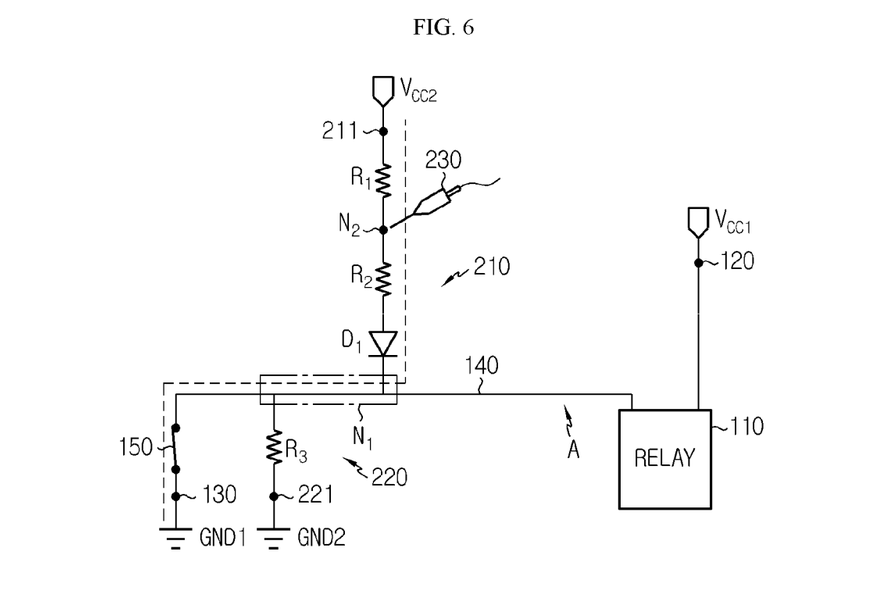

FIG. 6 shows an operation mode in which the driving switch 150 is turned on, and a normal state of the control line 140 (see arrow A). As illustrated in FIG. 6, since the driving switch 150 is turned on, the first node $N_1$ is connected to the ground GND 1 connected to the first low-potential node 130. Accordingly, a current flows along a dashed line of FIG. 6. As a result, a voltage of the second node $N_2$ is equal to a sum of a voltage applied to the second resistor $R_2$ and a voltage applied to the first diode $D_1$. That is, the voltage of the second node $N_2$ is calculated as shown in the following equation.

$$V(N_2)=V(D_1)+V(R_2)=V(D_1)+(V_{cc2}-V(D_1))*(R_2/(R_1+R_2))$$

Herein, $V(D_1)$ denotes the voltage applied to the first diode $D_1$, and $V(R_2)$ denotes the voltage applied to the second resistor $R_2$. In the above equation, $V(R_2)$ may be calculated by distributing a sum of a voltage applied to $R_1$ and a voltage applied to $R_2$, based on magnitude of resistance. That is, $V(R_2)$ is $(V_{cc2}-V(D_1))*(R_2/(R_1+R_2))$. The voltage $V(D_1)$ applied to the first diode $D_1$ is determined based on diode specifications and thus may be regarded as a constant.

<Operation Mode in which Driving Switch is Turned on, and Open State of Control Line>

Figure 7:
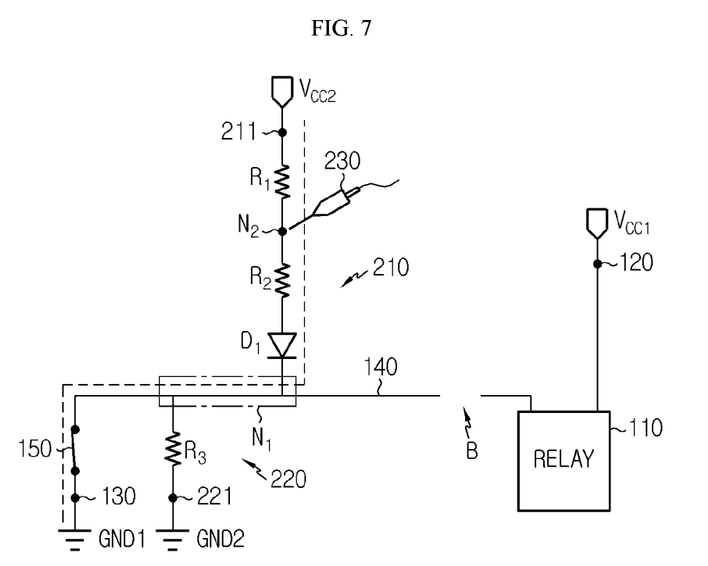

FIG. 7 shows an operation mode in which the driving switch 150 is turned on, and an open state of the control line 140 (see arrow B). As illustrated in FIG. 7, since the driving switch 150 is turned on and the control line 140 is disconnected, the first node $N_1$ is connected to the ground GND1 connected to the first low-potential node 130. Accordingly, a current flows along a dashed line of FIG. 7. As a result, a voltage of the second node $N_2$ is equal to a sum of a voltage applied to the second resistor $R_2$ and a voltage applied to the first diode $D_1$. That is, the voltage of the second node $N_2$ is calculated as shown in the following equation.

$$V(N_2)=V(D_1)+V(R_2)=V(D_1)+(V_{cc2}-V(D_1))*(R_2/(R_1+R_2))$$

Herein, $V(D_1)$ denotes the voltage applied to the first diode $D_1$, and $V(R_2)$ denotes the voltage applied to the second resistor $R_2$. In the above equation, $V(R_2)$ may be calculated by distributing a sum of a voltage applied to $R_1$ and a voltage applied to $R_2$, based on magnitude of resistance. That is, $V(R_2)$ is $(V_{cc2}-V(D_1))*(R_2/(R_1+R_2))$.

<Operation Mode in which Driving Switch is Turned on, and High-Potential Short State of Control Line>

Figure 8:
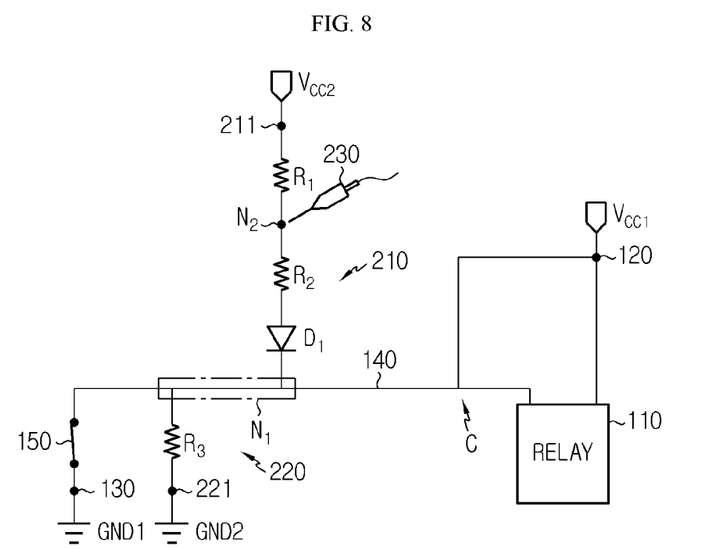

FIG. 8 shows an operation mode in which the driving switch 150 is turned on, and a high-potential short state of the control line 140 (see arrow C). As illustrated in FIG. 8, since the driving switch 150 is turned on and the first high-potential node 120 is connected to the control line 140, a voltage of the first node $N_1$ is equal to a voltage of the power supply $V_{cc1}$ connected to the first high-potential node 120. A potential of the power supply $V_{cc2}$ connected to the second high-potential node 211 is equal to or lower than a potential of the power supply $V_{cc1}$ connected to the first high-potential node 120, and the first diode $D_1$ is configured to allow a current to flow only from the second high-potential node 211 to the first node $N_1$. Accordingly, a voltage of the second node $N_2$ is equal to a voltage of the second high-potential node 211. That is, the voltage of the second node $N_2$ is $V_{cc2}$.

<Operation Mode in which Driving Switch is Turned on, and Low-Potential Short State of Control Line>

Figure 9:
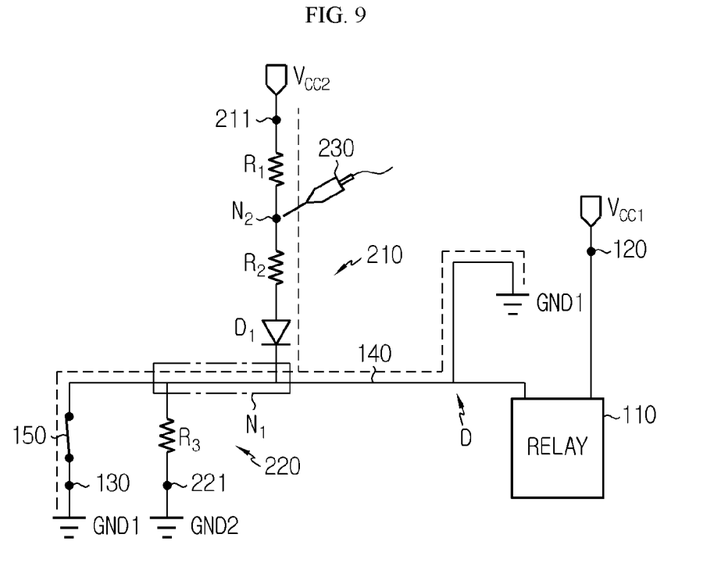

FIG. 9 shows an operation mode in which the driving switch 150 is turned on, and a low-potential short state of the control line 140 (see arrow D). As illustrated in FIG. 9, since the driving switch 150 is turned on and the first low-potential node 130 is connected to the control line 140, the first node $N_1$ is connected to the grounds GND1 and GND2. Accordingly, a current flows along a dashed line of FIG. 9. As a result, a voltage of the second node $N_2$ is equal to a sum of a voltage applied to the second resistor $R_2$ and a voltage applied to the first diode $D_1$. That is, the voltage of the second node $N_2$ is calculated as shown in the following equation.

$$V(N_2)=V(D_1)+V(R_2)=V(D_1)+(V_{cc2}-V(D_1))*(R_2/(R_1+R_2))$$

Herein, $V(D_1)$ denotes the voltage applied to the first diode $D_1$, and $V(R_2)$ denotes the voltage applied to the second resistor $R_2$. In the above equation, $V(R_2)$ may be calculated by distributing a sum of a voltage applied to $R_1$ and a voltage applied to $R_2$, based on magnitude of resistance. That is, $V(R_2)$ is $(V_{cc2}-V(D_1))*(R_2/(R_1+R_2))$.

A process of calculating a voltage of the second node $N_2$ in four available states of the control line 140 in an operation mode in which the driving switch 150 is turned off will now be described.

FIGS. 10 to 13 are circuit diagrams showing four available states of the control line 140 in an operation mode in which the driving switch 150 is turned off.

<Operation Mode in which Driving Switch is Turned Off, and Normal State of Control Line>

Figure 10:
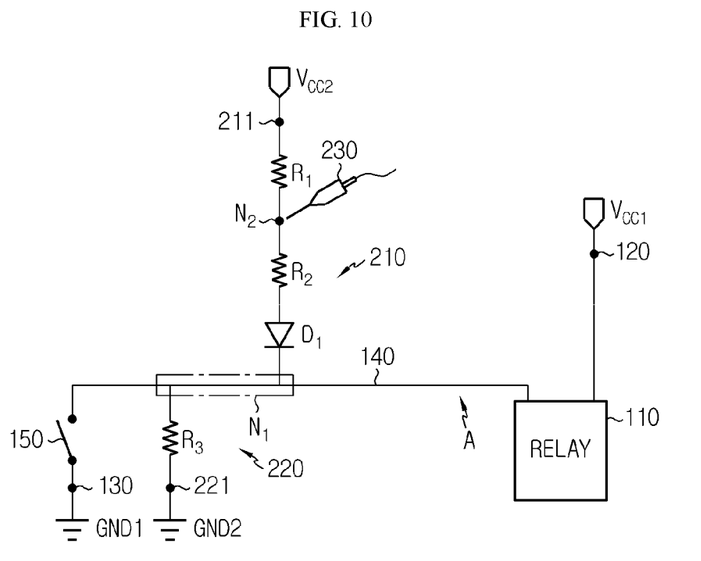
FIGS. 10 to 13 are circuit diagrams showing four available states of the control line in an operation mode in which the driving switch is turned off.

FIG. 10 shows an operation mode in which the driving switch 150 is turned off, and a normal state of the control line 140 (see arrow A). As illustrated in FIG. 10, since the driving switch 150 is turned off, the first node $N_1$ is connected to the first high-potential node 120 through the driven load 110, and is connected to the second low-potential node 221 through the second diagnostic line 220. Herein, a potential of the power supply $V_{cc2}$ connected to the second high-potential node 211 is equal to or lower than a potential of the power supply $V_{cc1}$ connected to the first high-potential node 120, and the first diode $D_1$ is configured to allow a current to flow only from the second high-potential node 211 to the first node $N_1$. Accordingly, a voltage of the second node $N_2$ is equal to a voltage of the second high-potential node 211. That is, the voltage of the second node $N_2$ is $V_{cc2}$.

<Operation Mode in which Driving Switch is Turned Off, and Open State of Control Line>

Figure 11:
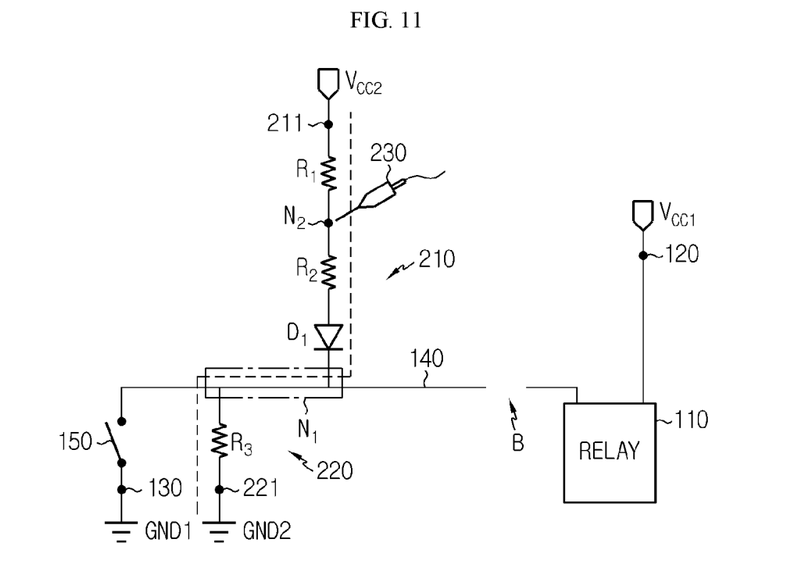

FIG. 11 shows an operation mode in which the driving switch 150 is turned off, and an open state of the control line 140 (see arrow B). As illustrated in FIG. 11, since the driving switch 150 is turned off and the control line 140 is disconnected, the first node $N_1$ is connected to the second low-potential node 221 through the second diagnostic line 220. Accordingly, a current flows along a dashed line of FIG. 11. In this case, a voltage of the second node $N_2$ is equal to a sum of a voltage applied to the third resistor $R_3$, a voltage applied to the first diode $D_1$, and a voltage applied to the second resistor $R_2$. That is, the voltage of the second node $N_2$ is calculated as shown in the following equation.

$$\begin{aligned}V(N_2) &= V(R_3) + V(D_1) + V(R_2) \\ &= V(D_1) + V(R_3) + V(R_2) \\ &= V(D_1) + (V_{cc2} - V(D_1))*((R_2 + R_3)/(R_1 + R_2 + R_3))\end{aligned}$$

Herein, $V(D_1)$ denotes the voltage applied to the first diode $D_1$, $V(R_2)$ denotes the voltage applied to the second resistor $R_2$, and $V(R_3)$ denotes the voltage applied to the third resistor $R_3$. In the above equation, $V(R_3)+V(R_2)$ may be calculated by distributing a sum of a voltage applied to $R_1$ and a voltage applied to $R_2$ and $R_3$, based on magnitude of resistance. That is, $V(R_3)+V(R_2)$ is $(V_{cc2}-V(D_1))*((R_2+R_3)/(R_1+R_2+R_3))$.

<Operation Mode in which Driving Switch is Turned Off, and High-Potential Short State of Control Line>

Figure 12:
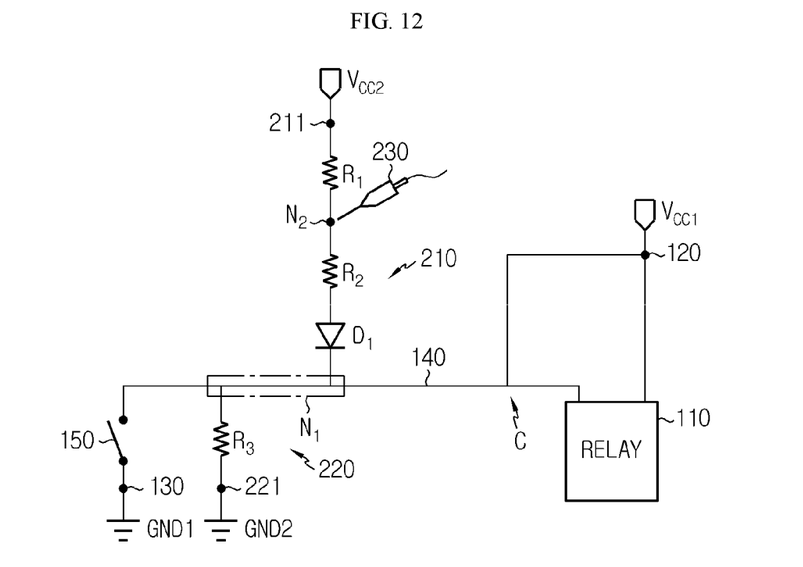

FIG. 12 shows an operation mode in which the driving switch 150 is turned off, and a high-potential short state of the control line 140 (see arrow C). As illustrated in FIG. 12, since the driving switch 150 is turned off but the first high-potential node 120 is connected to the control line 140, a voltage of the first node $N_1$ is equal to a voltage of the power supply $V_{cc1}$ connected to the first high-potential node 120. A potential of the power supply $V_{cc2}$ connected to the second high-potential node 211 is equal to or lower than a potential of the power supply $V_{cc1}$ connected to the first high-potential node 120, and the first diode $_{D1}$ is configured to allow a current to flow only from the second high-potential node 211 to the first node $N_1$. Accordingly, a voltage of the second node $N_2$ is equal to a voltage of the second high-potential node 211. That is, the voltage of the second node $N_2$ is $V_{cc2}$.

<Operation Mode in which Driving Switch is Turned Off, and Low-Potential Short State of Control Line>

Figure 13:
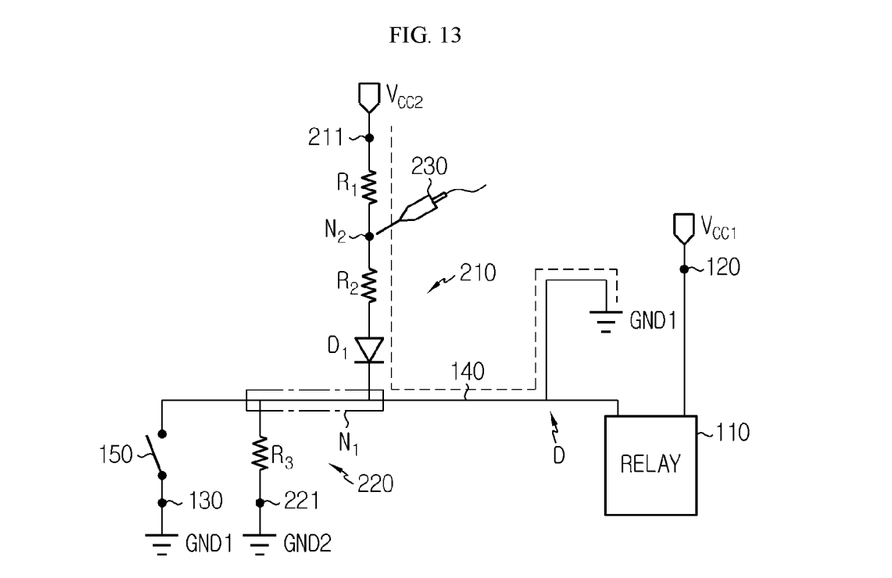

FIG. 13 shows an operation mode in which the driving switch 150 is turned off, and a low-potential short state of the control line 140 (see arrow D). As illustrated in FIG. 13, since the driving switch 150 is turned off and the first low-potential node 130 is connected to the control line 140, the first node $N_1$ is connected to the ground GND1 connected to the first low-potential node 130. Accordingly, a current flows along a dashed line of FIG. 13. A voltage of the second node $N_2$ is equal to a sum of a voltage applied to the second resistor $R_2$ and a voltage applied to the first diode $D_1$. That is, the voltage of the second node $N_2$ is calculated as shown in the following equation.

$$V(N_2)=V(D_1)+V(R_2)=V(D_1)+(V_{cc2}-V(D_1))*(R_2/(R_1+R_2))$$

Herein, $V(D_1)$ denotes the voltage applied to the first diode $D_1$, and $V(R_2)$ denotes the voltage applied to the second resistor $R_2$. In the above equation, $V(R_2)$ may be calculated by distributing a sum of a voltage applied to $R_1$ and a voltage applied to $R_2$, based on magnitude of resistance. That is, $V(R_2)$ is $(V_{cc2}-V(D_1))*(R_2/(R_1+R_2))$.

Figure 14:
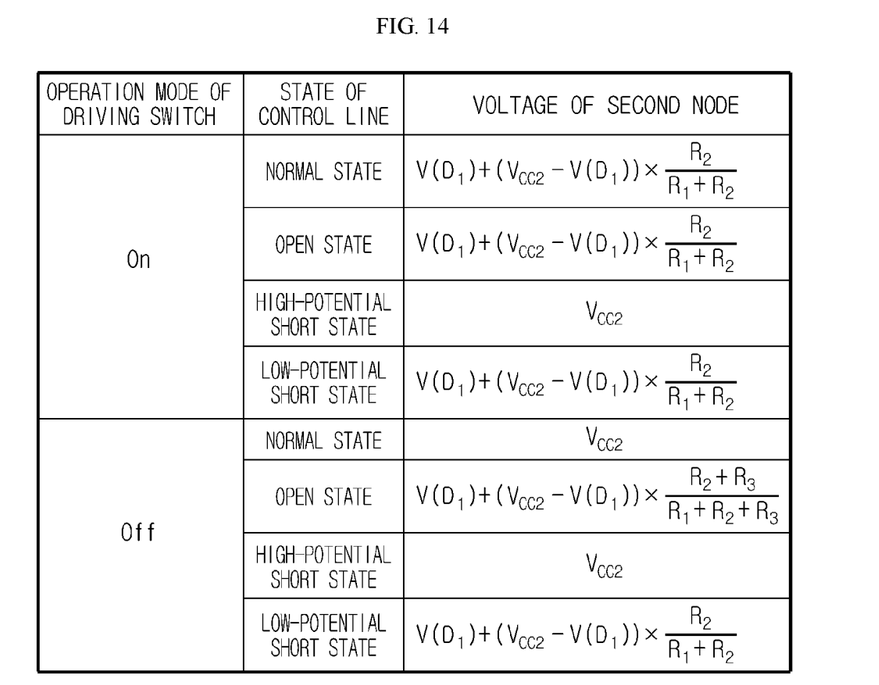
FIG. 14 is a diagram showing a diagnostic table according to an embodiment of the present disclosure.

FIG. 14 is a diagram showing a diagnostic table according to an embodiment of the present disclosure.

FIG. 14 shows a diagnostic table in which voltage values of the second node $N_2$ in the two operation modes and the four operation states described above in relation to FIGS. 6 to 13 are recorded.

As shown in the diagnostic table, in an operation mode in which the driving switch 150 is turned on, since a voltage of the second node $N_2$ is the same except for a high-potential short state, it may be determined only whether the control line 140 is in one of a normal state, an open state, and a low-potential short state, or in the high-potential short state. That is, it may be determined only whether the control line 140 is in the high-potential short state or not, and it may not be determined whether the control line 140 is in the normal state, in the open state, or in the low-potential short state.

As shown in the diagnostic table, in an operation mode in which the driving switch 150 is turned off, since the voltage of the second node $N_2$ differs except for the normal state and the high-potential short state, it may be determined whether the control line 140 is in the open state, in the low-potential short state, or in one of the normal state and the high-potential short state. That is, in the operation mode in which the driving switch 150 is turned off, it may not be determined whether the control line 140 is in the normal state or in the high-potential short state.

However, if the two operation modes are combined, the four states may be accurately diagnosed. That is, when the driving switch 150 is turned off, it may be determined whether the control line 140 is in the open state, in the low-potential short state, or in one of the normal state and the high-potential short state. Then, when the driving switch 150 is turned on, it may be determined whether the control line 140 is in the high-potential short state or not. In other words, since it may not be diagnosed whether the control line 140 is in the normal state or in the high-potential short state when the driving switch 150 is turned off but it may not be diagnosed whether the control line 140 is in the high-potential short state or not when the driving switch 150 is turned on, if the two operation modes are combined, all of the four states may be diagnosed.

In other words, the control unit may diagnose the state of the control line 140 by using a result measured in one operation mode if the state of the control line 140 is diagnosable using the voltage of the second node $N_2$, which is measured in any one of the two operation modes, and diagnose the state of the control line 140 by combining results of the two operation modes if the state of the control line 140 is not diagnosable using only a result measured in one operation mode.

A process of diagnosing the state of the control line 140 by using a premade diagnostic table by the control line diagnostic apparatus 200, according to an embodiment of the present disclosure will now be described.

Initially, the control unit turns on the driving switch 150. In an operation mode in which the driving switch 150 is turned on, the control unit receives a voltage of the second node $N_2$, which is measured by the voltage measurement unit 230. In this case, the control unit may store the voltage of the second node $N_2$, which is measured by the voltage measurement unit 230 in the operation mode in which the driving switch 150 is turned on, in a storage means or the like.

Then, the control unit turns off the driving switch 150. In an operation mode in which the driving switch 150 is turned off, the control unit receives a voltage of the second node $N_2$, which is measured by the voltage measurement unit 230. The control unit may store the voltage of the second node $N_2$, which is measured by the voltage measurement unit 230 in the operation mode in which the driving switch 150 is turned off, in the storage means or the like.

Thereafter, the control unit detects a voltage substantially the same as the voltage of the second node $N_2$, which is measured by the voltage measurement unit 230 in the operation mode in which the driving switch 150 is turned on, in the diagnostic table. If the voltage of the second node $N_2$ is substantially the same as a voltage of a high-potential short state in the diagnostic table, the control unit may diagnose the state of the control line 140 as the high-potential short state. Otherwise, if the voltage of the second node $N_2$ is substantially the same as a voltage of a normal state, a voltage of an open state, and a voltage of a low-potential short state in the diagnostic table, the control unit may diagnose the state of the control line 140 as one of the normal state, the open state, and the low-potential potential short state.

Then, the control unit detects a voltage substantially the same as the voltage of the second node $N_2$, which is measured by the voltage measurement unit 230 in the operation mode in which the driving switch 150 is turned off, in the diagnostic table. If the voltage of the second node $N_2$ is substantially the same as a voltage of the open state in the diagnostic table, the control unit may diagnose the state of the control line 140 as the open state. If the voltage of the second node $N_2$ is substantially the same as a voltage of the low-potential short state in the diagnostic table, the control unit may diagnose the state of the control line 140 as the low-potential short state. Otherwise, if the voltage of the second node $N_2$ is substantially the same as a voltage of the normal state and a voltage of the high-potential short state in the diagnostic table, the control unit may diagnose whether the control line 140 is in the normal state or in the high-potential short state, based on the diagnose result of the operation mode in which the driving switch 150 is turned on.

Figure 15:
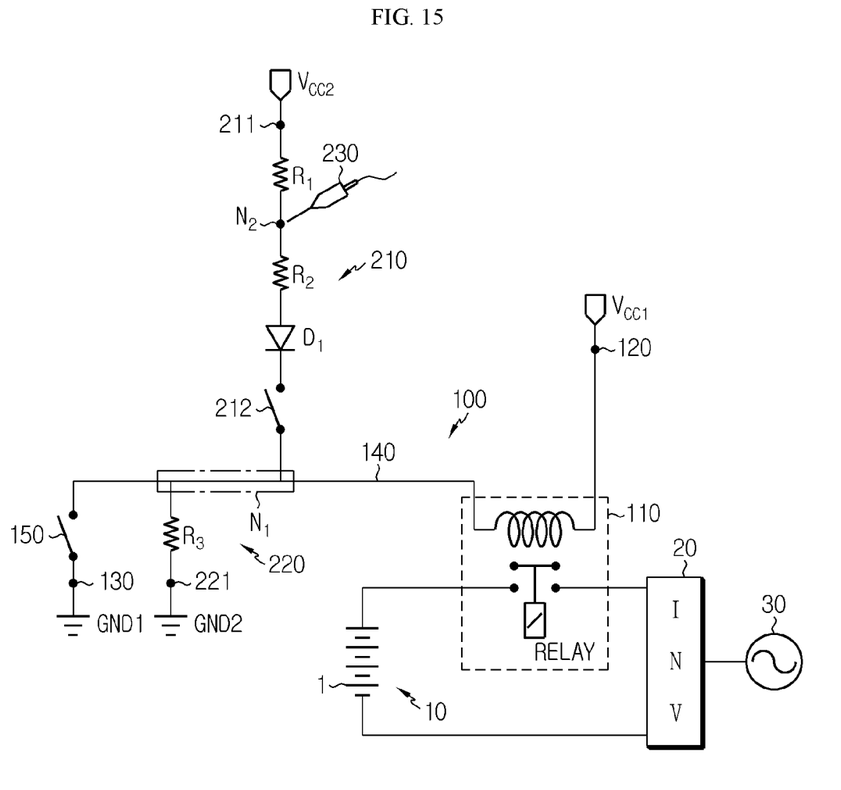
FIG. 15 is a circuit diagram of the control line diagnostic apparatus according to another embodiment of the present disclosure.

FIG. 15 is a circuit diagram of the control line diagnostic apparatus 200 according to another embodiment of the present disclosure.

Referring to FIG. 15, compared to the control line diagnostic apparatus 200 illustrated in FIG. 1 according to the previous embodiment, the control line diagnostic apparatus 200 according to the current embodiment of the present disclosure further includes a first diagnostic switch 212 on the first diagnostic line 210. Since the control line diagnostic apparatus 200 according to the current embodiment of the present disclosure merely further includes the first diagnostic switch 212 on the first diagnostic line 210 and other components thereof are the same as those described above in the previous embodiment, the following description is focused on differences therebetween.

The first diagnostic switch 212 is provided on the first diagnostic line 210, and may be a switching device configured to be selectively turned on or off based on a control signal. The first diagnostic switch 212 may be implemented as one of a variety of switching devices. According to an embodiment, the first diagnostic switch 212 may be implemented as a MOSFET. The first diagnostic switch 212 may be turned on or off by receiving a control signal from the control unit.

The control unit may turn on the first diagnostic switch 212 to diagnose the control line 140. On the other hand, the control unit may turn off the first diagnostic switch 212 not to diagnose the control line 140. That is, the control unit may control the first diagnostic switch 212 to disconnect the first diagnostic line 210 from the control line 140 at normal times to minimize influence of the first diagnostic line 210 on the driver circuit 100, and control the first diagnostic switch 212 to connect the first diagnostic line 210 to the control line 140 for a diagnostic operation.

Figure 16:
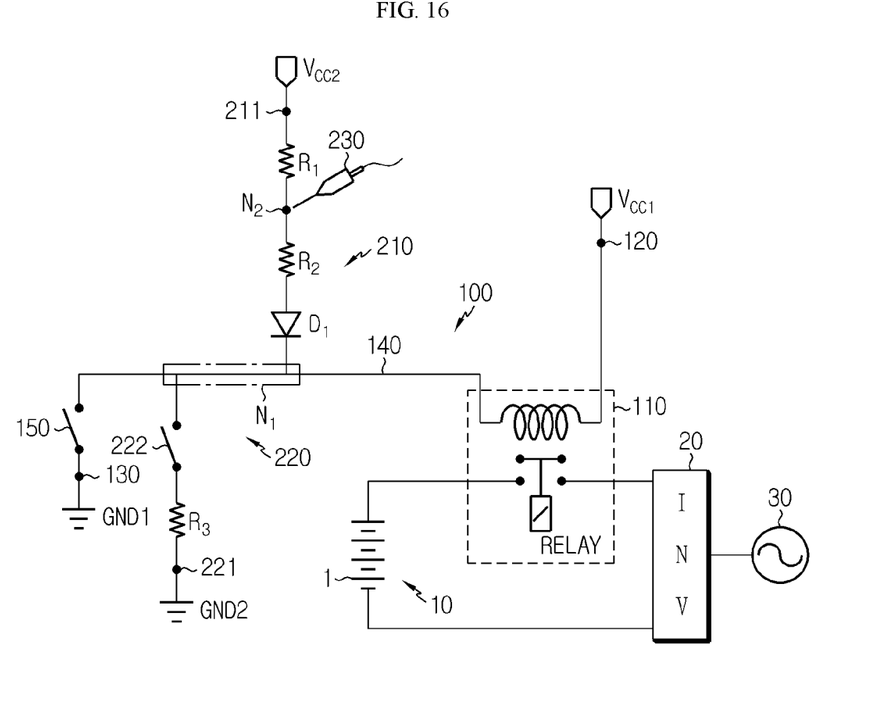
FIG. 16 is a circuit diagram of the control line diagnostic apparatus according to another embodiment of the present disclosure.

FIG. 16 is a circuit diagram of the control line diagnostic apparatus 200 according to another embodiment of the present disclosure.

Referring to FIG. 16, compared to the control line diagnostic apparatus 200 illustrated in FIG. 1 according to the previous embodiment, the control line diagnostic apparatus 200 according to the current embodiment of the present disclosure further includes a second diagnostic switch 222 on the second diagnostic line 220. Since the control line diagnostic apparatus 200 according to the current embodiment of the present disclosure merely further includes the second diagnostic switch 222 on the second diagnostic line 220 and other components thereof are the same as those described above in the previous embodiment, the following description is focused on differences therebetween.

The second diagnostic switch 222 is provided on the second diagnostic line 220, and may be a switching device configured to be selectively turned on or off based on a control signal. The second diagnostic switch 222 may be implemented as one of a variety of switching devices. According to an embodiment, the second diagnostic switch 222 may be implemented as a MOSFET. The second diagnostic switch 222 may be turned on or off by receiving a control signal from the control unit.

The control unit may turn on the second diagnostic switch 222 to diagnose the control line 140. On the other hand, the control unit may turn off the second diagnostic switch 222 not to diagnose the control line 140. That is, the control unit may control the second diagnostic switch 222 to disconnect the second diagnostic line 220 from the control line 140 at normal times to minimize influence of the second diagnostic line 220 on the driver circuit 100, and control the second diagnostic switch 222 to connect the second diagnostic line 220 to the control line 140 for a diagnostic operation.

Figure 17:
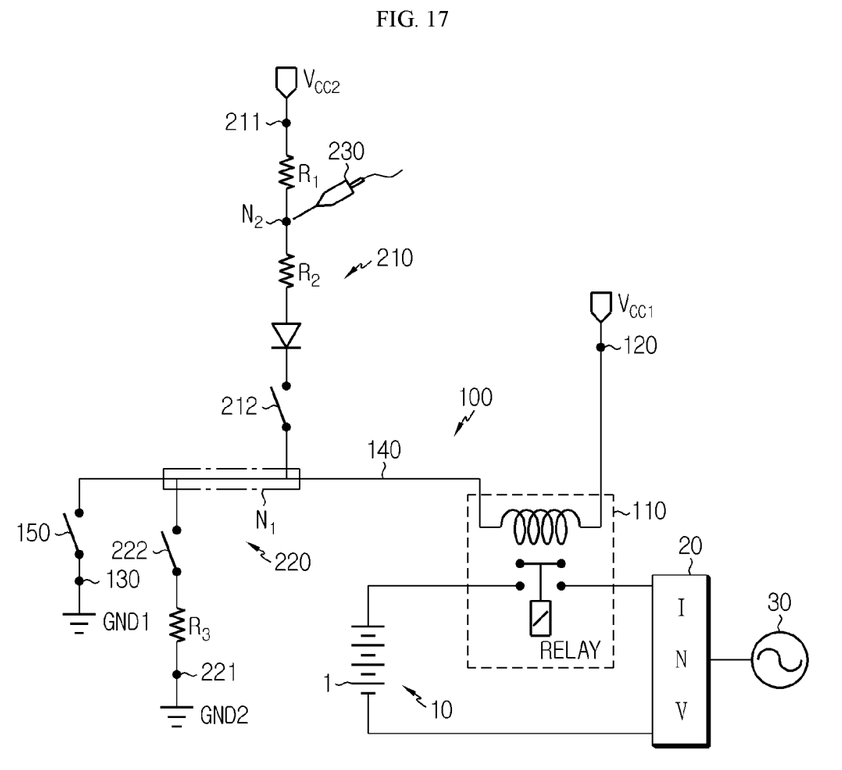
FIG. 17 is a circuit diagram of the control line diagnostic apparatus according to another embodiment of the present disclosure.

FIG. 17 is a circuit diagram of the control line diagnostic apparatus 200 according to another embodiment of the present disclosure.

Referring to FIG. 17, compared to the control line diagnostic apparatus 200 illustrated in FIG. 1 according to the previous embodiment, the control line diagnostic apparatus 200 according to the current embodiment of the present disclosure further includes a first diagnostic switch 212 on the first diagnostic line 210 and a second diagnostic switch 222 on the second diagnostic line 220. Since the control line diagnostic apparatus 200 according to the current embodiment of the present disclosure merely further includes the first diagnostic switch 212 on the first diagnostic line 210 and the second diagnostic switch 222 on the second diagnostic line 220 and other components thereof are the same as those described above in the previous embodiment, the following description is focused on differences therebetween.

The first and second diagnostic switches 212 and 222 are provided on the first and second diagnostic lines 210 and 220, respectively. Each of the first and second diagnostic switches 212 and 222 may be a switching device configured to be selectively turned on or off based on a control signal, may be implemented as one of a variety of switching devices, and may be turned on or off by receiving a control signal from the control unit.

The control unit may turn on the first and second diagnostic switches 212 and 222 to diagnose the control line 140. On the other hand, the control unit may turn off the first and second diagnostic switches 212 and 222 not to diagnose the control line 140. That is, the control unit may control the first and second diagnostic switches 212 and 222 to disconnect the first and second diagnostic lines 210 and 220 from the control line 140 at normal times to minimize influence of the first and second diagnostic lines 210 and 220 on the driver circuit 100, and control the first and second diagnostic switches 212 and 222 to connect the first and second diagnostic lines 210 and 220 to the control line 140 for a diagnostic operation.

In the above-described embodiments, the control line diagnostic apparatus 200 is included in the BMS as a part of the BMS. However, the BMS is merely an example and the control line diagnostic apparatus 200 is not limited to be included in the BMS as a part of the BMS. For example, the control line diagnostic apparatus 200 may be configured as an additional apparatus or may be included in a control device other than the BMS or the battery pack 10.

In the present disclosure, to execute the above-described control logics, the control unit may selectively include a processor, an application-specific integrated circuit (ASIC), a chipset, a logic circuit, a register, a communication modem, a data processing device, etc., which are well-known in the art.

Two or more of the control logics of the control unit may be combined, and the combined control logics may be written in computer-readable code and recorded on a computer-readable recording medium.

The recording medium is not limited to any type as long as the recording medium is accessible by a processor included in a computer. For example, the recording medium includes at least one selected from the group including read-only memory (ROM), random access memory (RAM), register, compact disc read-only memory (CD-ROM), magnetic tape, hard disk, floppy disk, and optical data recording device.

The computer-readable code may be modulated into a carrier signal and included in a communication carrier at a specific timing, and may be stored in and executed by network-coupled computers in a distributed fashion. Functional programs, codes, and code segments for implementing the combined control logics may be easily construed by programmers of ordinary skill in the art.

In various embodiments of the present disclosure, components named using "unit" should be understood as functionally distinguishable components rather than physically distinguishable components. Therefore, each component may be selectively integrated with another component or may be divided into sub-complements to efficiently execute the control logic(s). However, even when the components are integrated or divided, it will be understood by one of ordinary skill in the art that the integrated or divided components should be construed as being included in the scope of the present disclosure as long as functions thereof are constantly maintained.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A control line diagnostic apparatus for diagnosing a control line of a driver circuit in which a driven load is driven due to a current flowing through the control line from a first high-potential node to a first low-potential node when a driving switch having a higher potential than a potential of the driven load is turned on, the control line diagnostic apparatus comprising:
    a first diagnostic line having an end connected to a first node provided on the control line and the other end connected to a second high-potential node, and comprising a first resistor, a second resistor, and a first diode connected to one another in series;
    a second diagnostic line having an end connected to the first node and the other end connected to a second low-potential node, and comprising a third resistor;
    a voltage measurement unit configured to measure a voltage of a second node provided between the first and second resistors; and
    a control unit configured to set predetermined operation modes by controlling the driving switch and to diagnose a state of the control line by using voltage values of the second node, which are measured by the voltage measurement unit in the set operation modes,
    wherein the first diode is provided on the first diagnostic line to allow flow of a current from the second high-potential node to the first node.

2. The control line diagnostic apparatus of claim 1, wherein the control unit diagnoses the state of the control line by comparing a voltage value of the second node, which is measured in an operation mode in which the driving switch is turned on, and a voltage value of the second node, which is measured in an operation mode in which the driving switch is turned off, to values recorded in a premade diagnostic table.

3. The control line diagnostic apparatus of claim 1, wherein the state of the control line is one of:
    a high-potential short state in which the control line is connected to the first high-potential node;
    a low-potential short state in which the control line is connected to the first low-potential node;
    an open state in which the control line is disconnected; and
    a normal state.

4. The control line diagnostic apparatus of claim 1, wherein the first diagnostic line further comprises a first diagnostic switch configured to be selectively turned on or off, and
    wherein the control unit controls the first diagnostic switch to be turned on, in order to diagnose the control line.

5. The control line diagnostic apparatus of claim 1, wherein the second diagnostic line further comprises a second diagnostic switch configured to be selectively turned on or off, and
    wherein the control unit controls the second diagnostic switch to be turned on, in order to diagnose the control line.

6. The control line diagnostic apparatus of claim 1, wherein the first and second low-potential nodes are grounded.

7. The control line diagnostic apparatus of claim 1, wherein the second high-potential node has a potential equal to or lower than a potential of the first high-potential node.

8. The control line diagnostic apparatus of claim 1, wherein the driven load is a relay.

9. A battery management system (BMS) comprising the control line diagnostic apparatus of claim 1.

10. A battery pack comprising the control line diagnostic apparatus of claim 1.

* * * * *